United States Patent
Reiter et al.

(10) Patent No.: US 6,835,290 B2
(45) Date of Patent: Dec. 28, 2004

(54) SYSTEM AND METHOD FOR CONTROLLING THIN FILM DEFECTS

(75) Inventors: Jeffrey Shane Reiter, Palo Alto, CA (US); Stephen Eric Barlow, Hayward, CA (US); Zhiwei Cai, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/366,934

(22) Filed: Feb. 13, 2003

(65) Prior Publication Data

US 2003/0150712 A1 Aug. 14, 2003

Related U.S. Application Data

(60) Provisional application No. 60/357,042, filed on Feb. 13, 2002.

(51) Int. Cl.[7] ............................................. C23C 14/34
(52) U.S. Cl. .......................... 204/192.12; 204/298.21; 204/298.22; 204/298.26
(58) Field of Search ..................... 204/192.12, 298.21, 204/298.22, 298.06, 298.26

(56) References Cited

U.S. PATENT DOCUMENTS

| | | | |
|---|---|---|---|
| 5,683,561 A | 11/1997 | Hollars et al. | 204/298.25 |
| 5,814,196 A | 9/1998 | Hollars et al. | 204/298.15 |
| 5,972,184 A | 10/1999 | Hollars et al. | 204/298.09 |
| 6,117,281 A | 9/2000 | Novbakhtian | 204/192.16 |
| 6,156,171 A | 12/2000 | Hollars et al. | 204/298.25 |
| 6,488,824 B1 * | 12/2002 | Hollars et al. | 204/192.22 |

* cited by examiner

*Primary Examiner*—Steven Versteeg
(74) *Attorney, Agent, or Firm*—Raghunath S. Minisandram; Jesus Del Castillo

(57) ABSTRACT

A system and method for reducing and controlling the number of defects due to carbon inclusions on magnetic media is disclosed. A diamond like carbon protective layer is deposited on magnetic media using a rotary cathode target assembly. The target and cathode are cylindrical in shape and are mounted on holder that allows the target and cathode to rotate while holding a magnet fixed. The target surface is periodically swept in through a plasma which sputters off the surface of the target. This prevents the build up of redeposited material on the target and consequently keeps the target surface cleaner. The reduction of redeposited material on the target surface reduces the number of unwanted particulates which are ejected from the surface, manifesting themselves as disk defects.

20 Claims, 10 Drawing Sheets

FIG. 5 (TOP VIEW)

SYSTEM AND METHOD FOR CONTROLLING THIN FILM DEFECTS

This application claims priority from U.S. provisional application Ser. No. 60/357,042, filed on Feb. 13, 2002.

BACKGROUND OF THE INVENTION

1. Field of the Invention

The present invention relates to the reduction of defects resulting from magnetron sputtering, and, more particularly to reducing and controlling the number of defects due to carbon inclusions on magnetic media.

2. Description of the Related Art

Computer disc drives commonly use components made out of thin films to store information. Typical disc drive thin film components include read-write head elements for reading and writing magnetic signals and magnetic media for writing magnetic signals onto. Conventional magnetic media is usually made by depositing a stack of thin film layers over each other as illustrated in FIG. 1A.

FIG. 1A is an illustration showing the layers of a conventional magnetic media structure including a substrate 103, a seed layer 105, a magnetic layer 107, a protective layer 109, and a lube layer 111. The first layer of the media structure is the substrate 103, which is typically made of nickel-phosphorous plated aluminum or glass that has been textured. The seed layer 105, typically made of chromium, is the first thin film deposited onto the substrate 103. The magnetic layer 107, typically made of a magnetic alloy containing cobalt (Co), platinum (Pt) and chromium (Cr), is a thin film deposited on top of the seed layer 105. The protective layer 109, typically made of carbon and hydrogen, is a thin film that is deposited on top of the magnetic layer 107. Finally the lube layer 111, typically made of a polymer containing carbon (C) and fluorine (F) and oxygen (O), is deposited on top of the protective layer 109.

The durability and reliability of recording media is achieved primarily by the application of the protective layer 109 and the lube layer 111. The protective layer 109 is typically an amorphous film called diamond like carbon (DLC), which contains carbon and hydrogen and exhibits properties between those of graphite and diamond. Thin layers of DLC can be deposited on disks using a variety of conventional thin film deposition techniques such as ion beam deposition (IBD), plasma enhanced chemical vapor deposition (PECVD), magnetron sputtering, radio frequency sputtering or chemical vapor deposition (CVD). During the deposition process, adjusting sputtering gas mixtures of argon and hydrogen varies the concentrations of hydrogen found in the DLC. Since typical thicknesses of protective layer 109 are less than 100 Angstroms, lube layer 111 is deposited on top of the protective layer 109 for added protection, lubrication and enhanced disk drive reliability. Lube layer 111 further reduces wear of the disc due to contact with the magnetic head assembly.

Although there are several techniques available for depositing DLC films as a protective layer 109 for magnetic recording media, as previously discussed, planar magnetron is the preferred method because of its wide spread use and good resultant film properties. However, there are problems associated with using planar magnetron sputtering including low yields resulting of the high number of defects found on the disk.

FIG. 1B is an illustration showing a cross sectional side view of a conventional magnetron sputtering system including a target 110, a target erosion zone 115, a redeposition area 120, a backing plate 125, a coolant 130, magnets 135, a shunt 140, a cathode 145 and a plasma 150. Target 110 is a conventional sputtering target that is mounted to the backing plate 125 with indium. Magnets 135 are typically permanent magnets, which are used to confine plasma 150 near the surface of the target. Coolant 130 is typically water which is circulated behind backing plate 125 to cool the target while it is being sputtered. Shunt 140 diverts the magnetic field to the exterior of the target 110 causing electrons to be trapped and consequently causing sputtering of the target 110.

The sputtering process removes target material from the target erosion zone 115 and deposits that material throughout the chamber including the substrate, chamber walls and target 110. If reactive gases such as ethylene or methane are used then additional material other than the sputtered material is deposited throughout the chamber and substrate. The area on the target 110 where sputtered material gets redeposited and any film grows as a result of using reactive gasses is called the redeposition area 120. This redeposited material, located in the redeposition area 120, is sometimes ejected from the target 110 surface and bombards the substrate creating a defect, as explained in more detail below.

FIG. 1C is a block diagram showing a front view of typical planar sputtering cathode including a target 110, a target erosion zone 115 and a redeposition area 120. The target erosion zone 115, resembling a racetrack, is the area of the target 110 where material is sputtered off. The redeposition area 120 is the area on the target where carbon is redeposited during the sputtering process. Redeposition area 120 includes the rectangular area in the center of the target erosion zone 115 as well as the outer part of the target 110 between the target erosion zone 115 and the edge of the target 110.

FIG. 1D is an illustration showing a top view of a conventional magnetron sputtering system including a first chamber wall 155, a second chamber wall 160, a top view of eight planar cathode mounted sputtering targets with redeposition areas 120, a top view of eight plasma patterns 165 and a top view of a transport mechanism 170. First chamber wall and second chamber wall are both conventional walls of a vacuum chamber typically constructed out of stainless steel. The eight sputtering patterns represent the material sputtered from the erosion pattern 115 along with ionized sputtering gas atoms (argon). Transport mechanism 170 is a transportation device that moves disks or pallets full of disks in front of plasma 150 as further described with reference to FIG. 1E below.

FIG. 1E is an illustration showing a front view of one side of a conventional magnetron sputtering system including four targets 110 with erosion zones and redeposition areas and a transport 170 located within a vacuum chamber 180 as well as disks 185, a pallet 187 and a beam 191. Vacuum chamber 180 is a conventional chamber, typically made of stainless steel, that houses targets 110 and transport 170. Disks 185 are substrates 103 with seed layer 105 and magnetic layer 107 already on them and ready for depositing protective layer 109 to be deposited. Pallet 187 is typically made of aluminum and is machined to hold disks 185 in an upward position. Beam 191 is typically a stainless steel beam from which pallet 187 hangs and is transported in vacuum chamber 180.

A significant disadvantage with conventional planar magnetron sputtering techniques, such as the one described with reference to FIGS. 1A–1E, is the high number of particulates that are produced on the substrate. If too many particulates are deposited on a substrate then the substrate is defective and cannot be used. Although defects resulting from excessive particulates on a substrate can occur when sputtering any material, the problem is enhanced when sputtering carbon.

Typical carbon defects include particulates containing carbon and traces of the sputtering gases used (typically argon) that range in size from sub micron to micron in diameter. These defects, which have a high content of SP2/SP3 hybridization, are often found embedded deeply into the NiP coated aluminum substrate manifesting themselves as glide height asperities and/or thermal asperities when the magneto-resistive recording head glides over them. The rate at which these defects are generated is time dependent. New or recently resurfaced targets have a low emission rate for these defects. As the targets are sputtered, the rate increases to a maximum, and then decreases over time to a stable level. For this example of planar magnetrons, the maximum defect rate takes approximately 60 hours to be reached and then decreases over the next 120 hours of operation. The final defect rate maintains at 2–3% product loss until the targets are replaced or resurfaced.

In one model explaining the formation of particulates on a carbon surface, particulates are ejected from the redeposition area of a sputtered target and are deposited on the substrate. In this model, the defects arising out of carbon particulates increase as the redeposited material on the target increases. During the sputtering process, some of the sputtered material is redeposited back on the areas of the target material. Redeposited material is defined as the material that is sputtered off of a target and lands back on the target. This can include the target material plus other materials such as argon, hydrogen or other impurities that get commingled with the target material during the sputtering process. As the redeposited material builds up over time, stress fracturing occurs in the redeposition area 120 resulting in ejection of particulate material and a roughening of the redeposition area. Since the trajectory of these high velocity particles is random, statistically some of the particles collide with the surface of the substrate being coated. During this collision, the high velocity particles impart to the substrate sufficient energy to melt the Nickel phosphate (NiP) coating on the substrate at the contact site and to deform the surface of the substrate sufficiently to embed the particle or a proportion of the particle deeply into the NiP material. Finally, these defects manifest themselves as glide height asperities and/or thermal asperities when a magneto-resistive recording head glides over the defect, which can result in unacceptable recording media. If enough defects are found on a recording disk then the disk is rejected resulting in lower yields and higher cost.

Therefore what is needed is a system and method that reduces the amount of redeposited material on the target, consequently reducing the number of particulates ejected from the surface of the target and creating defects on the substrate. Although such a system and method for reducing substrate defects is needed in all areas of thin film growth the need is especially high in the area of recording media manufacture. Defects produced on magnetic media during the thin film deposition process are usually carried through to the finished product because subsequent processes, such as lubrication, coat and conform to the defect geometry. Defects on magnetic media often cause thermal asperities and head crashes resulting in unusable magnetic media and consequently low yields and higher cost in manufacturing magnetic media.

SUMMARY OF THE INVENTION

In order to reduce the number of defects per disk arising from particulates produced in the magnetron sputtering processes, a rotary magnetron sputtering system and method is used for depositing thin films. The rotary magnetron cathode target assembly consists of a magnet, a cylindrical cathode, a cylindrical target, a shaft for connecting to a rotary drive mechanism for rotating the assembly and a coolant. The magnet is located inside the cylindrical cathode and remains stationary as the cathode and target rotate around it. The cathode and target are coupled to the shaft which is attached to a rotary drive mechanism that rotates the shaft and coupled cathode and target.

The method of using the rotary magnetron cathode to reduce the number of defects per disk includes igniting a plasma at the surface of the target causing the target surface closest to the magnet and exposed to the plasma to be sputtered off. Next, the target and cathode are rotated around the shaft, the magnet remains stationary. The stationary magnet forces the plasma to remain stationary as the target moves around. Therefore, rotating the cathode and target about the shaft produces the effect of sweeping the target surface in front of the plasma so that only the portion of the target surface that is exposed to the plasma is sputtered off. This prevents build up of redeposited material because the entire surface gets sputtered off. As the target surface rotates, the material that is redeposited onto the surface is again sputtered off as that portion of the surface with redeposited material enters the plasma. The effect of this rotary cathode target assembly is that the entire surface is repeatedly being sputtered off so that redeposited material is not allowed to get so thick that it eventually dislodges from the surface. This dislodged material then enters the plasma where it is superheated and explodes into smaller high-energy particles that collide and embed into the disk causing a defect on the disk. This method of depositing carbon onto disks prevents the redeposited material from dislodging from the surface and entering the plasma.

These and various other features as well as advantages which characterize the present invention will be apparent upon reading of the following detailed description and review of the associated drawings.

BRIEF DESCRIPTION OF THE INVENTION

DETAILED DESCRIPTION OF THE PREFERRED EMBODIMENTS

The invention provides a system and method for reducing defects resulting from sputtering including but not limited to magnetron sputtering. In particular, the invention provides a system and method for reducing the number of defects due to carbon inclusions on magnetic media.

Figure 2:
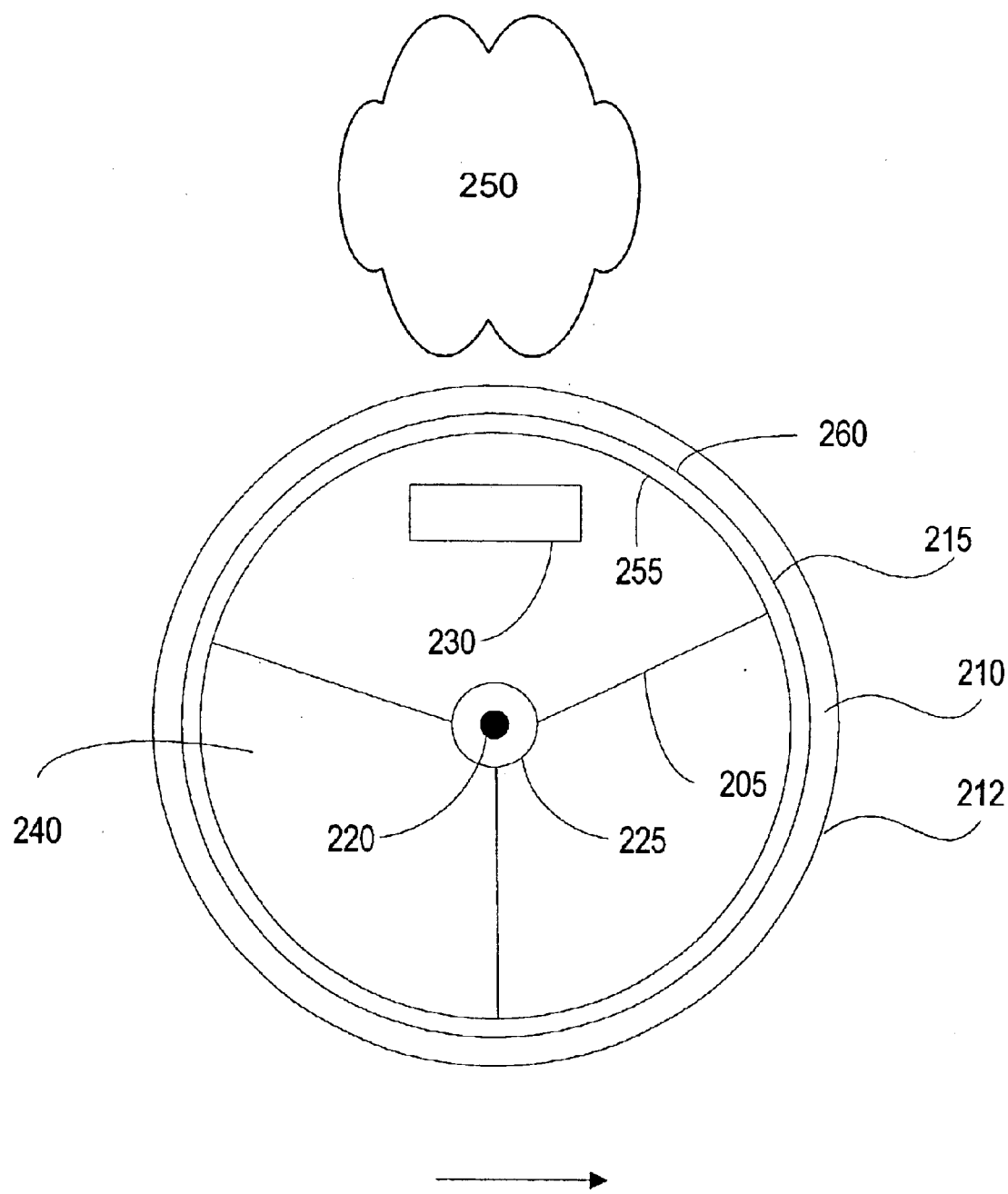
FIG. 2 is a block diagram showing a rotary sputtering cathode target assembly in accordance with an embodiment of the invention.

FIG. 2 is an illustration showing a top view of one embodiment of the rotary cathode target assembly, for sputtering, including a rotatable holder 205, target 210, a target surface 212, a cathode 215, an axis of rotation 220, a shaft 225, a magnet 230, coolant 240 and a plasma region 250. Rotatable holder 205, which holds and supports target 210, cathode 215 and coolant 240, is made from a sturdy metal such as stainless steel or aluminum. Moreover, rotatable holder 205 is built to allow target 210 and cathode 215 to rotate about the axis of rotation 220 while magnet 230 remains stationary. Target 210 and target surface 212 can be made of any material that can be sputtered. Some common materials include carbon, silicon, chromium, cobalt and cobalt alloys. Target 210 and target surface 212 are formed into a rotationally symmetric shape such as a cylinder. Target 210 and target surface 212 are rotated about an axis of rotation 220, which coincides with the symmetry axis of target 210. Magnet 230, can be a permanent magnet or an electrical magnet, which is located near target 210 and is separated from plasma region 250 by target 210. Typical permanent magnets include SmCo and NdFeB while typical electrical magnets include conventional copper windings attached to a power supply. Magnet 230 must be chosen so that the magnetic field lines originating from the magnet 230 penetrate the target 210 and target surface 212 and are present in the plasma region 250. The magnetic field is considered present in the plasma region 250 when it's magnitude is a measurable value that is non-zero. There are no other restrictions on the magnetic field including the direction of the magnetic field vector except that its magnitude is non-zero. Coolant 240 can be any liquid or gas effective in conducting heat away from the target 210 and cathode 215 including water and argon, for example. Coolant 240 is circulated over cathode 215 and magnet 230 to carry away heat generated during the sputtering process. Plasma region 250 is a conventional plasma typically made of ionized gas including argon, xenon or nitrogen used to bombard and sputter target 210.

In order to rotate target 210 and cathode 215 about an axis of rotation 220 without affecting the sputtering process both target 210 and cathode 215 are built to be rotationally symmetric. In this embodiment, both target 210 and cathode 215 are cylindrical in shape. Cathode 215 has a cylindrical inner surface 255, cylindrical outer surface 260, a first sealed end (not shown) and a second sealed end (not shown). Inner surface 255 contacts the coolant 240 while the outer surface 260 contacts the target 210. First sealed end is typically an attached plate that forms a seal keeping coolant 240 from leaking out. Similarly, second sealed end is typically an attached plate that forms a seal keeping coolant 240 from leaking out of the second end of the cathode. First sealed end also has coolant inlet and coolant outlet for flowing coolant 240 through the inside of the cathode for cooling during the sputtering process. Both coolant inlet and coolant outlet are typically attached onto first sealed end in a manner that is compatible with ultrahigh vacuum system.

In an alternative embodiment, the coolant is not used to cool the cathode and target during the sputtering process. The coolant can be eliminated when low powers are used for sputtering because heating is not a problem. When the heating rate is low, sufficient cooling can be achieved with the use of direct mechanical link such as copper, eliminating the need for using harder to control liquids and gases. This system is advantageous because liquids and gasses are kept out of the vacuum chamber. In this alternative embodiment the first sealed end and the second sealed end of the cathode 215 are replaced with a first open end and a second open end respectively. The coolant inlet and the coolant outlet are also eliminated. This alternative embodiment is advantages because it is easier to build and maintain.

Figure 3:
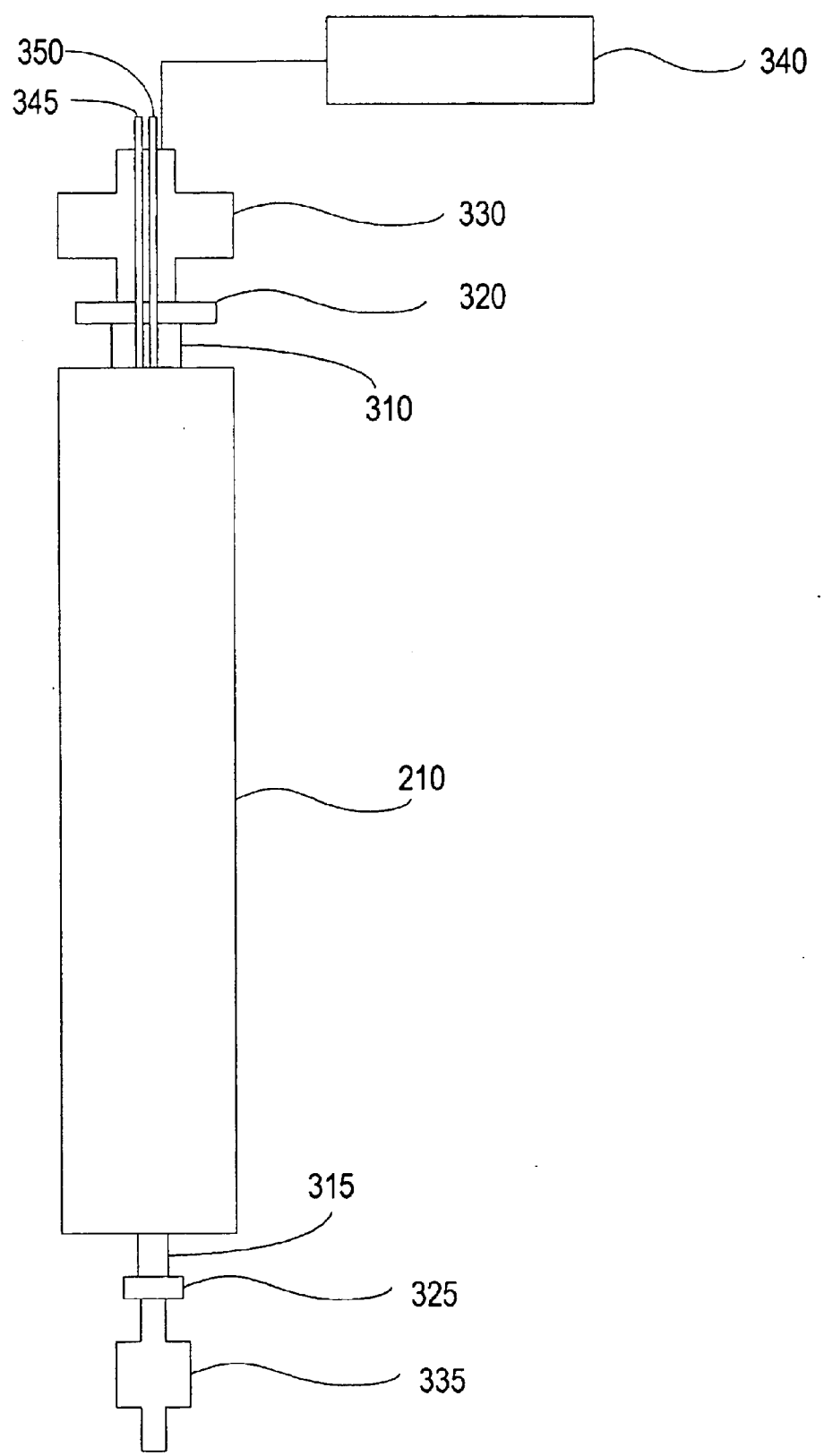
FIG. 3 is a block diagram showing a side view of the rotary sputtering cathode target assembly in accordance with an embodiment of the invention.

FIG. 3 is an illustration showing a side view 300 of one embodiment of the rotary sputter cathode target assembly including a target 210, a first shaft end 310, a second shaft end 315, a first coupler 320, a second coupler 325, a first rotary vacuum feed-through 330, a second rotary vacuum feed-through 335, a module 340, a coolant inlet 345 and a coolant outlet 350. Target 210 encloses the cathode, magnet and coolant as was described with reference to FIG. 2 above. Module 340 supports the rotary drive mechanism as well as electrical connections and power supplies.

In one embodiment, there is a shaft 225 along the axis of rotation 220, which runs the entire length of target 210. First shaft end 310 and second shaft end 315 are the ends of the shaft that extend past the target 210 and which are attached to first coupler 320 and second coupler 325. The shaft material is made out of a metallic material such as copper or aluminum which is both conductive and durable enough to support the torque put on the shaft due to rotation of the cathode and target material. The first shaft end 310 and the second shaft end 315 are attached to first coupler 320 and second coupler 325 respectively. First coupler 320 and second coupler 325 are used to connect shaft 225, which supports target 210 and cathode 215 through rotatable holder 205, to first vacuum feed-through 330 and second vacuum feed-through 335. This type of connection allows for removal of the target 210 and cathode 215 from a vacuum chamber without removal of the feed-throughs and therefore minimizing the chances of developing vacuum leaks. Module 340, which is coupled to first vacuum feed-through, contains a rotary drive mechanism for rotating the target 210 and cathode 215 as well as an electrical connection for supplying power to target 210 and cathode 215. The electrical connection to the rotating cathode is done through brushes located in module 340, which is positioned outside of the vacuum process so that particles generated by the brush contact do not generate defects.

First vacuum feed-through 330 and second vacuum feed-through 335 are used mainly when the rotary drive mechanism is located outside of the process chamber. Rotary drive mechanism generates rotary motion of the target 210 and cathode 215 about the axis of rotation 220. Rotary motion involves rotating the target 210 and cathode 215 at about one revolution per minute about its axis of rotation 220. There are however no restrictions on the rate of rotation. In another embodiment, where the rotary drives are located inside the chamber, the vacuum feed-throughs 330 are omitted.

In an alternative embodiment second shaft end 315, second coupler 325 and second vacuum feed-through 335 are omitted. This type of design can be advantage if the entire cathode-target assembly is light enough and sturdy enough to remain stable during rotary motion. The advantages are that it has fewer components and is therefore less expensive, easier to use and less likely to malfunction.

Figure 4:
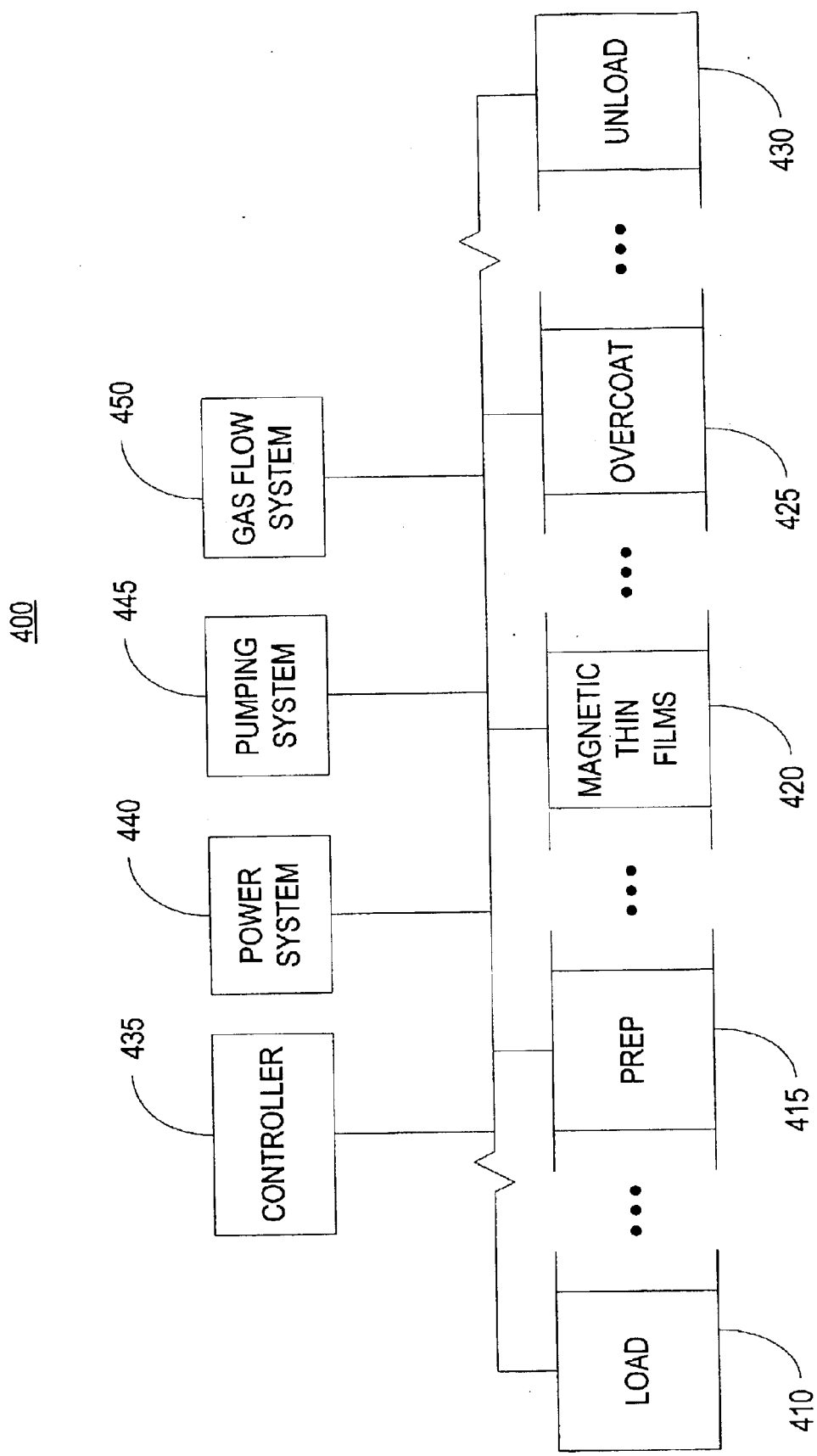
FIG. 4 is a block diagram showing a thin film deposition system used to deposit the magnetic media.

FIG. 4 represents a multilayer thin film deposition system 400 equipped with a rotary sputter cathode for depositing diamond like carbon (DLC) protective layers 109. System 400 preferably includes a loader 410, a PREP 415, a magnetic thin film depositor 420, an overcoat depositor 425, an unloader 430, a controller 435, a power system 440, a pumping system 445 and a gas flow system 450. Although, this embodiment is described in terms of using rotary cathode sputtering for depositing carbon in the overcoat depositer 425, the rotary cathode target assembly 300 can be used to replace any planar magnetron sputter target assembly and consequently can be used in PREP 415 or magnetic thin film depositor 420.

Loader 410 and unloader 430 represent conventional load locks that allow substrates to be transferred into and out of a vacuum chamber without venting the entire vacuum system. PREP 415 represents a preparation chamber and can be heaters, coolers additional thin film deposition chambers, etc. The generic term PREP 415 is used to describe processes before the deposition of the magnetic layer 107 because conventional processes such as heating of the substrate 103 and deposition of the seed layer 105 are well known in the art. Magnetic thin film depositor 420 represents the deposition of the magnetic thin film stack including the magnetic layers and any spacers needed for magnetic properties. Typically magnetic thin film depositor 420 includes several planar magnetron-sputtering apparatuses that sputter Co based targets. Overcoat depositor 425 represents a thin film deposition chamber using rotary cathode target assembly 300 for sputter depositing DLC protective layer 109 in accordance with an embodiment of the invention. Power system 440 represents power supplies used to power the system 400 and include power supplies for heaters, conveyers, DC magnetrons, rf sources, etc. Pumping system 445 represents all pumps and valves used to evacuate the vacuum chambers including mechanical pumps, turbo pumps, cryogenic pumps and gate valves. Gas flow system 450 represents the gas delivery equipment such as mass flow controllers, valves, piping and pressure gauges.

Figure 5:
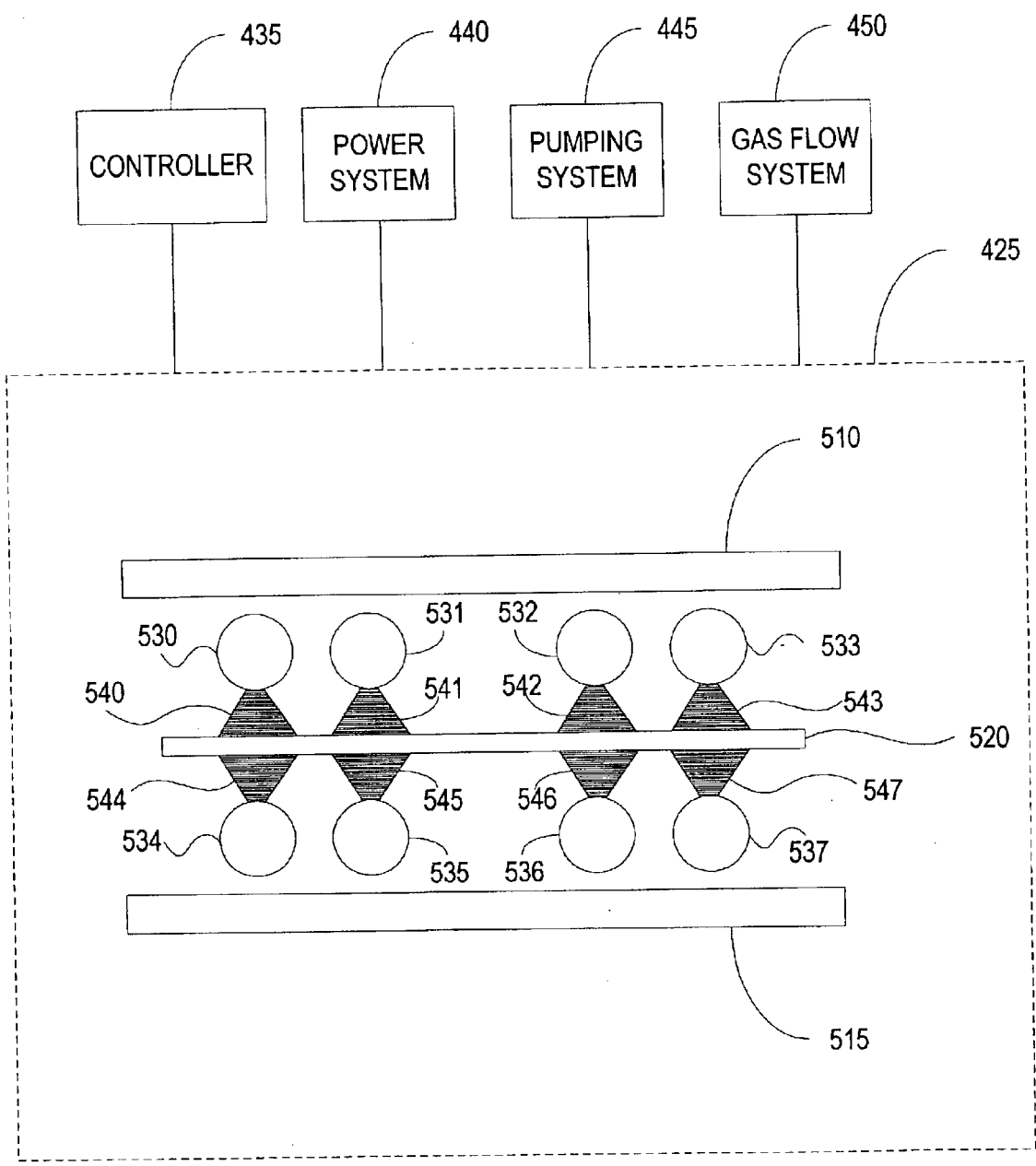
FIG. 5 is a top view of a rotary sputtering cathode incorporated into carbon overcoat deposition chamber 425 in accordance with an embodiment of the invention.

FIG. 5 is an illustration showing a detailed top view of overcoat processing chamber 425 including a first vacuum chamber wall 510, a second vacuum chamber wall 515, a transport 520, eight rotary cathode targets 530–537 respectively, eight sputtering patterns 540–547 respectively, in accordance with one embodiment of the invention. Controller 435, power system 440, pumping system 445 and gas flow system 450 are also shown coupled to overcoat processing chamber 425. The eight rotary cathode targets 530–537 are arranged into two banks with each bank having four rotary cathode targets each. The first bank consists of rotary cathode targets 530–533 and the second bank consists of rotary cathode targets 534–537. The first bank and second bank are arranged to permit substrates to pass in between the two banks so that both sides of the substrates are coated with a thin film of the sputtered target. In an alternative embodiment the two banks of cathode target assemblies only include one cathode target assembly in each bank. In this alternative embodiment the first bank has a target, a magnet and a rotatable holder from the first cathode target assembly and the second bank has a second target, second magnet, and second rotatable holder wherein the second target is positioned to permit movement of the substrate between target and the second target.

First vacuum chamber wall 510 and second vacuum chamber wall 515 are stainless steel walls of a conventional vacuum chamber which include feed-throughs for electrical connectors, rotary mechanical connectors, gauges, gas lines and pumping lines. Transport 520 is an overhead transportation mechanism that transports a hanging pallet containing disks or substrates through the overcoat-processing chamber 425. As the pallet containing disks or substrates moves through overcoat processing chamber the disks are coated with carbon as is further discussed with reference to FIG. 7 below. The corresponding confined plasmas generate sputtering patterns 540–547 that are conical in shape and are composed of ionized gases used for sputtering such as argon, xenon or ethylene as well as carbon atoms sputtered off the target 210 from the cathode target assembly 300.

Controller 435 represents the hardware and software that controls operation of the multilayer thin film deposition system 400. The portion of controller 435 that controls the rotary cathode target assembly 300 includes a drive rotation mechanism 340 for rotating the cathode target assembly 300 as well as sensors to monitor the rate of rotation, voltage, temperature and rate of coolant flow within cathode target assembly 300. The rotation mechanism can be a single motor coupled to all eight cathode target assemblies 300 through a conventional chain, for example; several motors wherein each motor is coupled to more than one of the eight cathode target assemblies 300; or a single motor for each of the of the eight cathode target assemblies 300.

The eight confined plasmas having sputtering patterns 540–547 originate at the target surface 212 of each of the eight corresponding cathode target assemblies 300 and spread out according to some distribution which can be conical. The plasma 250 consists of electrons trapped by a magnetic field in the small region near the target surface 212 opposite the side of magnet 230. The magnetic field from magnet 230 penetrates the target 210 and target surface 212 trapping electrons near the target surface 212. These trapped electrons then ionize the sputtering gas atoms, which are accelerated towards the target surface 212 because of the potential difference between the plasma 250 and the target 210 and cathode 215. The accelerated ions bombard the target surface 212 and sputter carbon from the target surface 212. The sputtered carbon atoms leave the target surface 212 of each of the cathode target assemblies 300 according to a conical distribution pattern, which makes up the confined plasmas and sputtering patterns 540–547. These sputtered atoms are deposited onto the magnetic media disks growing a thin film of DLC protective overcoat 109 on the disk.

During rotation of cathode target assembly 300, magnet 230 remains fixed as target 210 sweeps in front of the plasma 250 causing uniform sputtering of the entire cylindrical target surface 212. By periodically sweeping the target surface 212 in front of the plasma 250, the carbon target 210 mounted on the cathode target assembly 300 erodes uniformly, minimizing the redeposited material on the target. As previously defined the redeposition area on the target includes sputtered material that gets redeposited and any film that grows as a result of using reactive gasses. In accordance with one embodiment of the invention, a typical erosion pattern at any given time resembles a rectangle which is arced to conform to the cylindrical target surface 210 with an arced width approximately equal to the width of the magnet and a length approximately equal to the length of the target surface 210. As the cathode target assembly 300 rotates, the target surface 210 sweeps through the plasma, consequently subjecting the target surface to the plasma and cleaning the target surface. Cleaning the target surface includes eliminating the redeposited material by sputtering the redeposited material off of the target, as well as removing oxide layers or other foreign material that end up on the target surface that could affect films grown through the sputtering process. Rotating the target in a plasma so that a substantial portion of the target is sputtered essentially cleans the target surface on a regular periodic basis by sputtering it clean. Since the rotation rate is such that redeposited material is periodically removed from the target surface 210, before too much accumulates, substantial amounts of redeposited material which can dislodge and get ejected into the plasma are not allowed to form. Ultimately this leads to fewer defects on a disk and higher yields as is further discussed with reference to FIG. 8 below. Additionally, this method of periodically rotating, or sweeping, a target into the sputtering region increases utilization of the target 210 to almost 100% and consequently increases the life of a target because the entire target is eroded rather than just the erosion zone 115 seen in the prior art.

Figure 6:
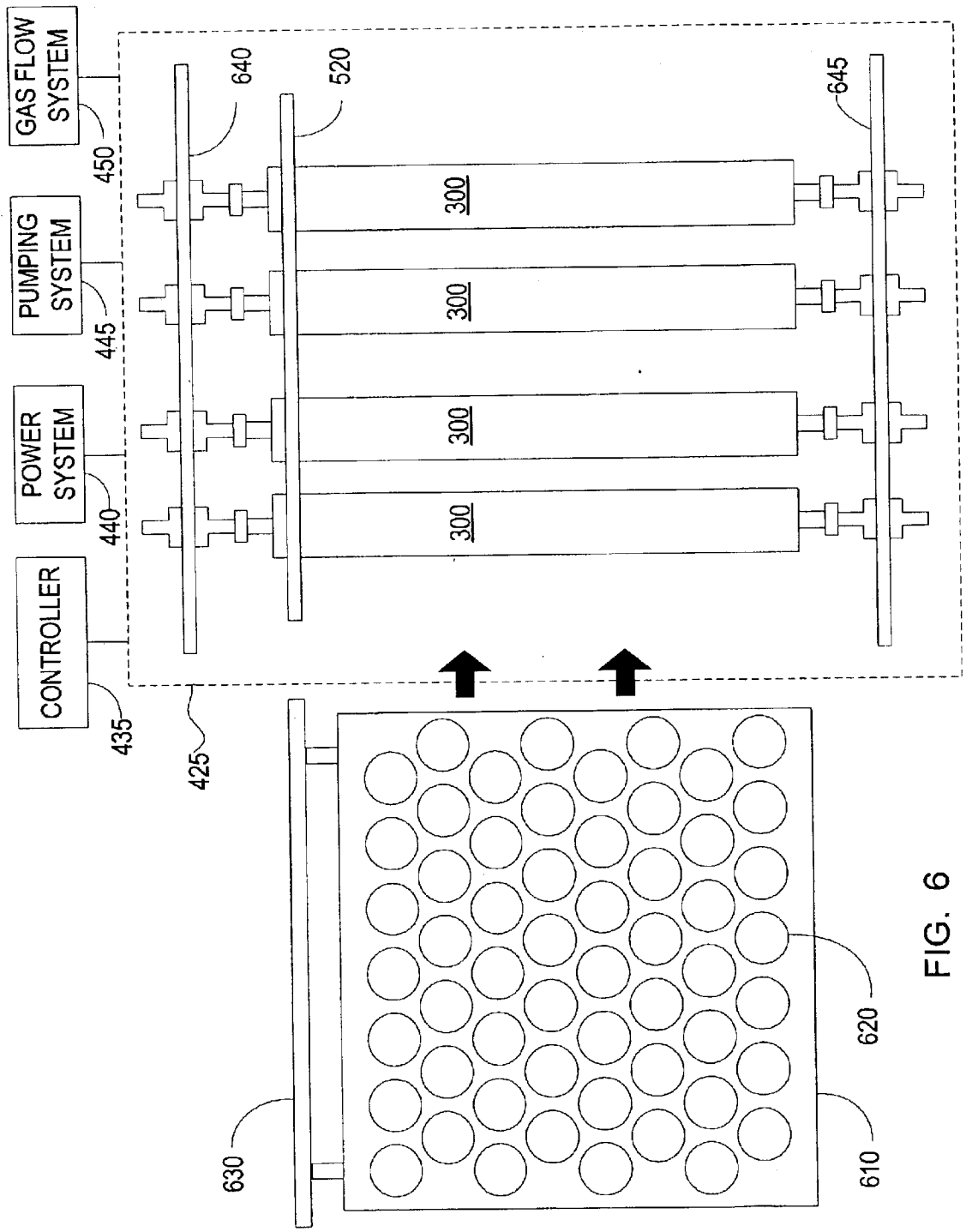
FIG. 6 is a front view of one side of a rotary sputtering cathode incorporated into carbon overcoat deposition chamber 425 in accordance with an embodiment of the invention.

FIG. 6 is an illustration showing a detailed side view of a pallet 610, containing disks 620, hanging from a second transport 630 going into overcoat processing chamber 425, which further includes side views of a top vacuum chamber wall 640, a bottom vacuum chamber wall 645, a transport 520, and four rotary cathode targets assemblies 300 in accordance with one embodiment of the invention. Controller 435, power system 440, pumping system 445 and gas flow system 450 are also shown attached to overcoat processing chamber 425.

Pallet 610 is an aluminum square plate with slots machined into it for holding disks 620 in a vertical position. The slots further include lips to securely hold the disks in the vertical position. Although pallet 610 is shown as a square with fifty-six slots, it can be of any shape and can have any number of slots machined into it provided the number of slots fit within the area of pallet 610. Typically, pallet 610 is loaded with disks 620 and is hanging from a transport that transports the pallet along with the disk into overcoat processing chamber 425.

The rotary cathode target assemblies 300 are rotating before pallet 610 and disks 620 enter the overcoat process chamber 425. The cathode target assemblies 300 are typically set to rotate at a constant rate of rotation at all times but can be set to rotate only when pallet 610 is passing in front of the cathodes. The rotation rate is chosen so that a substantial portion of the redeposited material on the target surface is removed during one revolution of the target. This rate varies according to sputtering power, pressure, temperature and process gas. For example, a lower sputtering power may require a slower rotation rate. Similarly, different process gasses (such as argon, argon-hydrogen mixtures, argon-ethylene mixtures, argon-methane mixtures, argon-hydrogen-nitrogen mixtures, etc) may require different rotation rates because of the rate at which redeposited material builds up on the target surface. However, a typical range of rotation rates is 1 revolution per minute to 100 revolutions per minute and a typical rotation rate is ten revolutions per minute. Plasma 250 is ignited before pallet 610 enters the overcoat deposition chamber 425.

Although plasma 250 can be left on at all times it is preferably ignited shortly before pallet 610 along with disks 620 are transported into overcoat process chamber 425. After igniting plasma 250 and starting rotation of rotary cathode target assemblies 300, transport 520 is turned on. External transport 630 is then turned on, transporting pallet 610 and disks 620 through all eight sputtering patterns 540–547 and in front of target surfaces 212. During this transport process, pallet 610 and disks 620 are never stopped. Their motion must be continuous all the way through the eight sputtering patterns 540–547. Although this embodiment describes moving disks, it works equally well for moving substrates.

Figure 7:
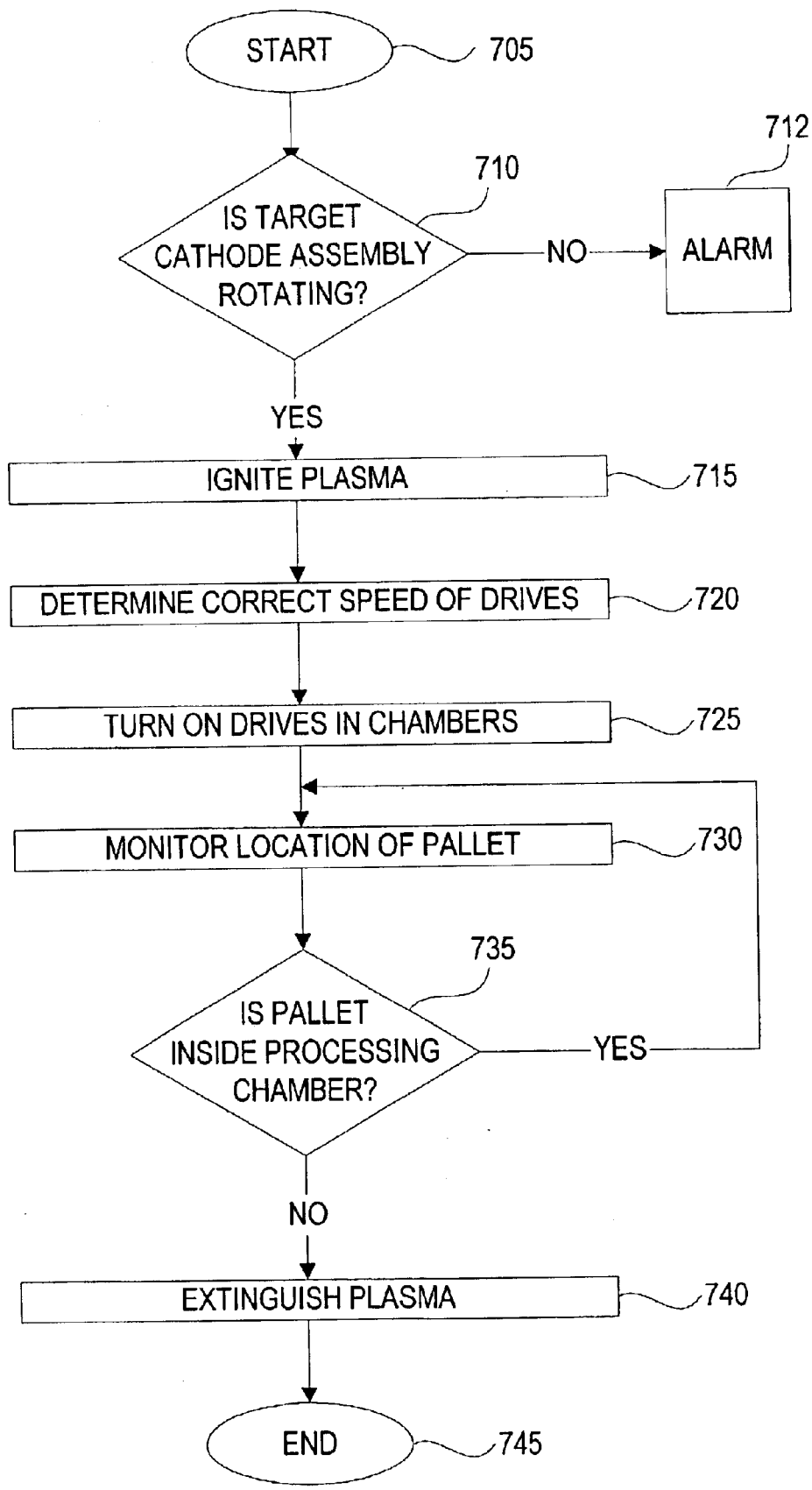
FIG. 7 is a flowchart showing the process steps used to deposit a carbon overcoat in deposition chamber 425 in accordance with one embodiment of the invention.

FIG. 7 is a flowchart showing the process steps used to deposit a carbon protective overcoat 109 in deposition chamber 425 in accordance with one embodiment of the invention. First in step 705, pallet 610 arrives to a position in thin film deposition system 400 where it is ready to begin the overcoat deposition process. This typically occurs two chambers before overcoat depositor 425. Next in step 710, a decision is made as to whether the cathode target assemblies 300 is rotating at an optimal rate which is set to minimize the amount of redeposited material on the target surface 212. Typically, all eight cathode target assemblies 300 are rotated at the same speed. This, however, is not necessary and each can be rotated at different speeds, if needed, to optimize the thin film deposition process. If the decision reached in step 710 is yes then the plasma 250 is ignited in step 715 by supplying a voltage to the cathode and target assembly 300. Voltages used are typically a few hundred volts negative but can vary depending on the deposition rate desired and the gas pressure in the processing chamber. Igniting a plasma typically requires setting appropriate plasma conditions such as 5–10 milli-torr of argon gas and negative 200 volts. Igniting the plasma in step 715 subjects a portion of the outside surfaces of the targets to the plasma. By then rotating the cathode target assemblies 300, the entire surface of the target is sputtered. This process of rotating the target relative to the plasma cleans the target surface by removing target material from the entire surface of the target. However, if the decision reached in step 710 is that the targets and cathodes are not rotating at the correct speed then an alarm is given in step 712 and the process ends.

Next in step 720 the speed at which pallet 610 will be transported through the overcoat depositor 425 in front of the cathode target assemblies 300 is determined. The speed is determined by calculating the amount of time needed to grow the desired protective overcoat 109 thickness using the current film growth rate and using that time to estimate the speed of the pallet 610 and disks 620. After the transport speed is determined, the transports in the process chamber, the preceding chamber and the following chamber are turned on in step 725 and the pallet 610 along with disks 620 move through the overcoat depositor 425 in front of cathode target assemblies 300. As the pallet 610 and disks 620 move through the chamber in front of the plasma and cathode target assembly 300, the pallet's 610 location is monitored in step 730. Next in step 735 a decision is made as to whether the pallet 610 is still inside the overcoat depositor 425. If any part of the pallet 610 is still inside overcoat depositor 425 then the position of the pallet 610 continues to be monitored otherwise the plasma is extinguished in step 740. Finally, in step 745 the pallet 610 along with disks 620 move to the next process in the film deposition system 400 which is usually the unload station 430 where the pallet 610 and disks 620 are removed from the thin film deposition system 400. Although the method is described in terms of depositing thin films on disks it will be recognized by those skilled in the art that the deposition can be done on substrates just as well.

Figure 1A:
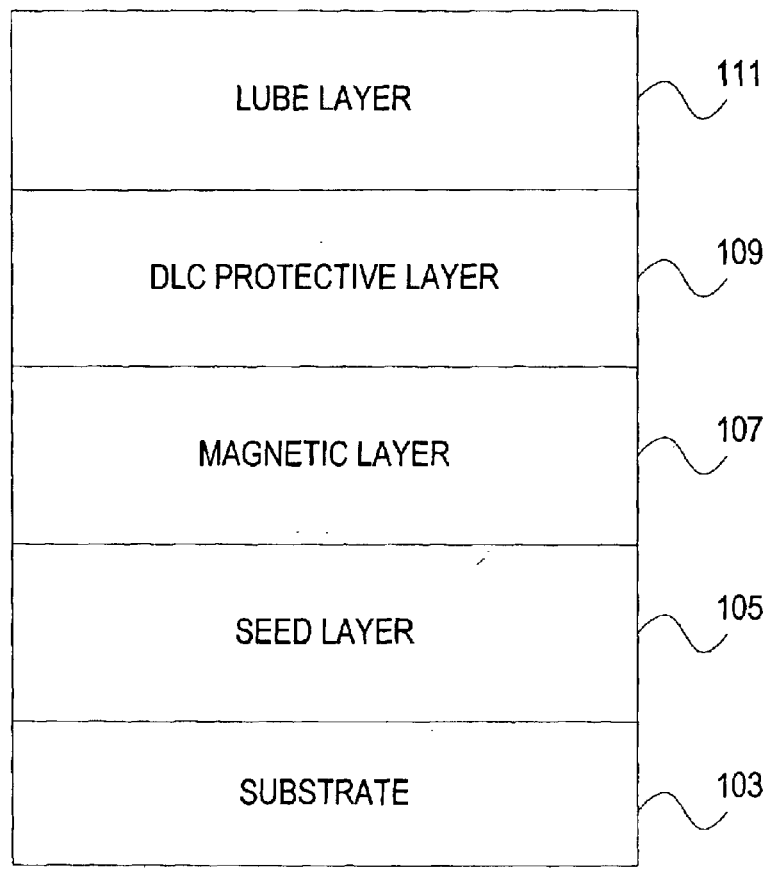
FIG. 1A is a block diagram showing a prior art conventional magnetic media structure.
Figure 1B:
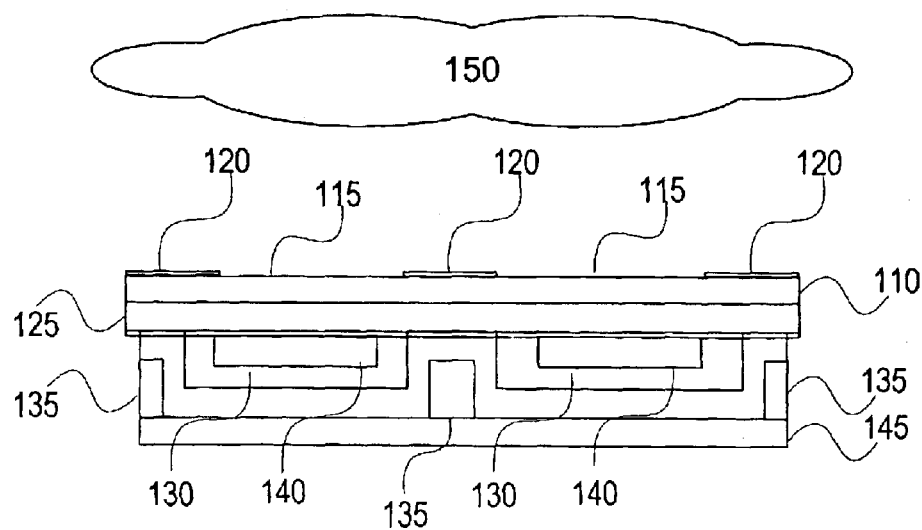
FIG. 1B is a block diagram showing a cross sectional side view of a typical planar magnetron sputtering cathode with target.
Figure 1C:
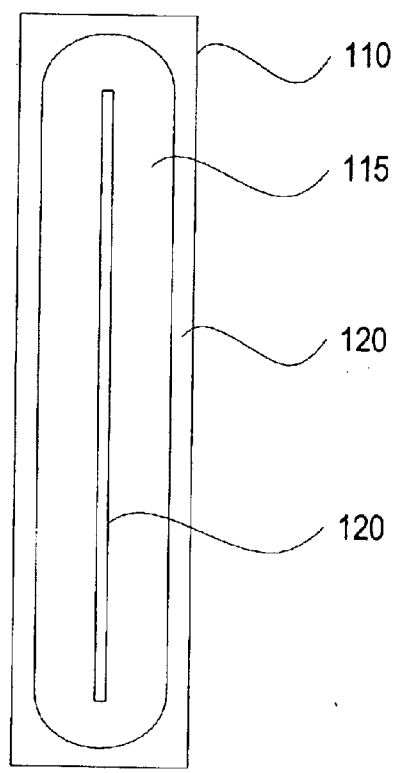
FIG. 1C is a block diagram showing a front view of typical planar magnetron sputtering cathode.
Figure 1D:
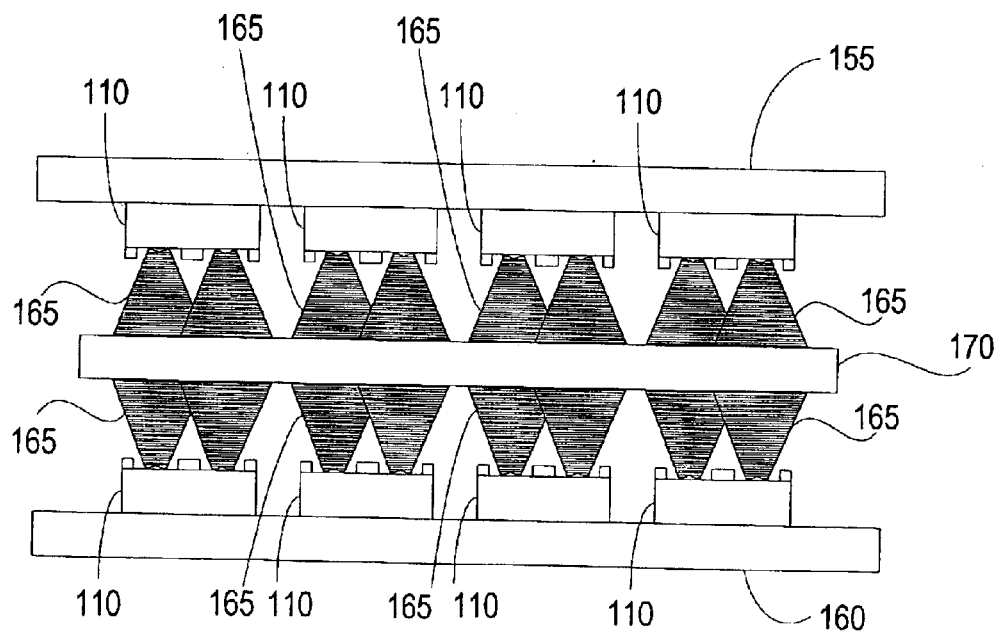
FIG. 1D is a top view of the prior art planar magnetron sputtering cathode and target incorporated into a deposition chamber.
Figure 1E:
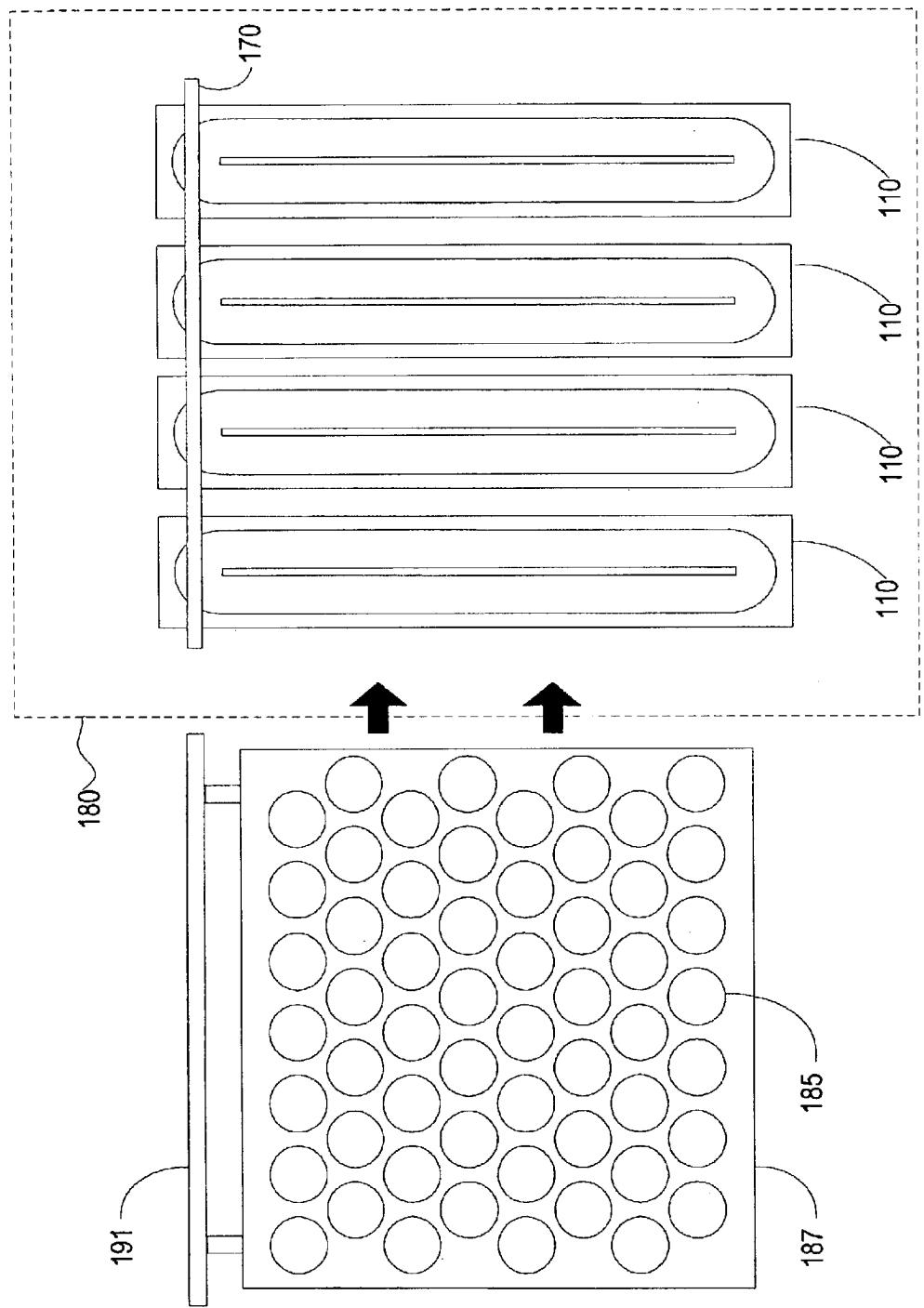
FIG. 1E is a side view of the prior art planar sputtering cathode and target incorporated into a deposition chamber.
Figure 8:
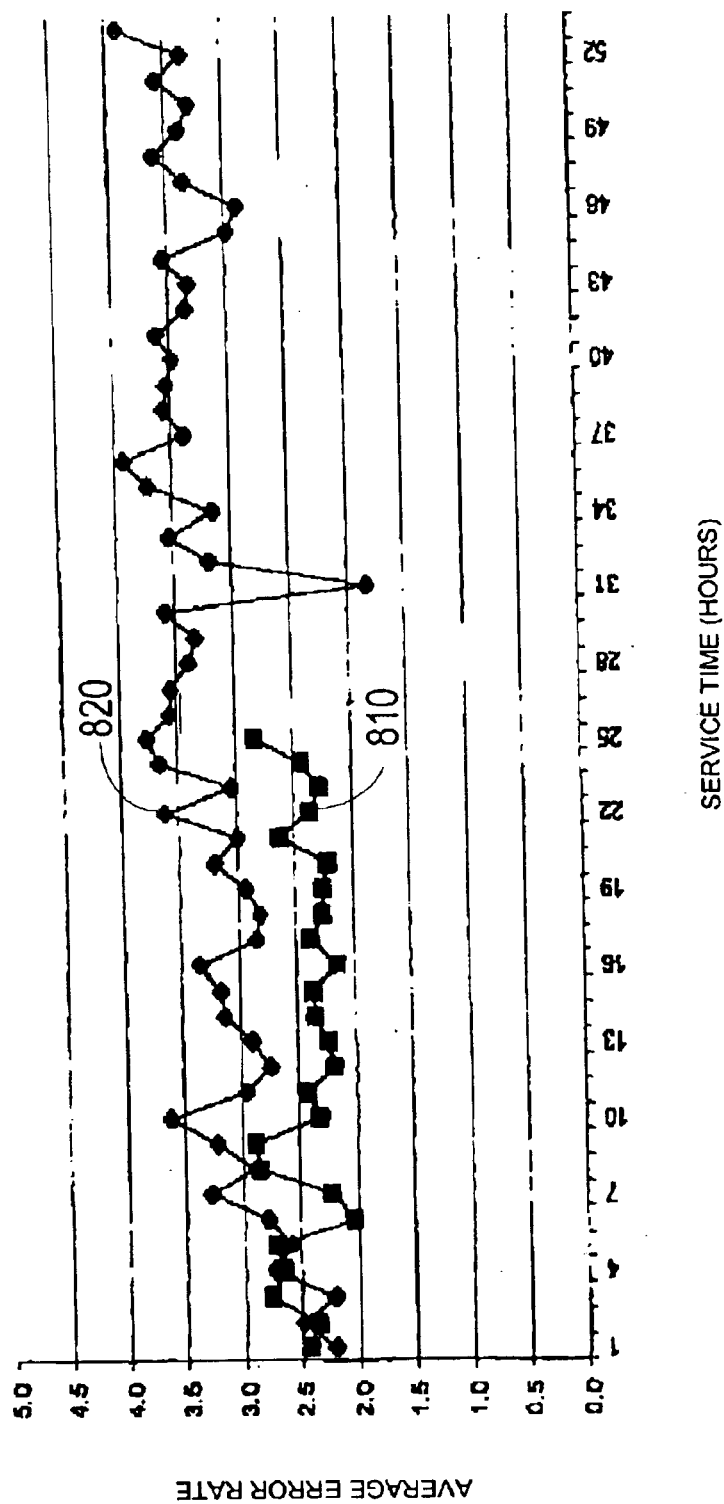
FIG. 8 is a yield chart comparing levels of defects due to carbon inclusions both with conventional magnetron sputtering and rotary cathode sputtering techniques.

FIG. 8 is a chart comparing the average errors per disk as a function of service time for both the prior art conventional planar target assembly shown in FIG. 1C and the rotary cathode target assembly 300. Measurement of the average error is performed using glide test heads that glides over the media, as the media rotates at thousands of revolutions per minute, imitating read-write head in finished disk drives. Among the various factors that trigger an error are glide hits, which occur when glide heads contact defects such as those commonly produced with planar magnetron sputter deposition of carbon. Control group trend 810 shows the average errors per disk for disks made using the prior art planar magnetron sputtering cathode and target 100 to sputter protective overcoat 109 as a function of service time. Similarly, experimental group trend 820 shows the average errors per disk for disks made using the rotary cathode target assembly 300 to sputter protective overcoat 109, as a function of time. Service time is the time measured in hours starting from when the overcoat-processing chamber 425 was serviced and the targets either changed or resurfaced. The data suggests that sputtering with rotary cathode target assembly 300 instead of conventional planar magnetron sputtering significantly reduces the number of defects on a disk.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

We claim:

1. A method of depositing a thin film, the method comprising the steps of:
    a) igniting a plasma for sputtering a target;
    b) subjecting a portion of an outside surface of said target to said plasma;
    c) rotating said target to subject substantially all of the outside surface of said target to said plasma;
    d) transporting a substrate in front of said target to deposit a thin film on said substrate; and
    e) extinguishing said plasma once said substrate is no longer in front of said target.

2. The method of claim 1 wherein said step of subjecting a portion of an outside surface of a target to a plasma further includes the step of confining said plasma.

3. The method of claim 1 wherein said step of subjecting a portion of an outside surface of a target to a plasma further includes the step of sputtering said target.

4. The method of claim 1 wherein said step of rotating said target includes rotating said target at a rotation rate of about 1 revolution per minute to about 100 revolutions per minute.

5. The method of claim 1 wherein said step of rotating said target includes rotating said target at a rotation rate of about 10 revolutions per minute.

6. The method of claim 1 wherein said step of transporting a substrate in front of said target further includes passing said substrate through a sputtering pattern.

7. The method of claim 1 wherein said step of transporting a substrate in front of said target further includes passing said substrate through a sputtering pattern at a constant speed.

8. A method of depositing a thin film, the method comprising the steps of:
    a) determining if a substrate is in position to begin sputtering;
    b) igniting a plasma for sputtering a target;
    c) rotating said target relative to a plasma to sputter said target and remove redeposition material from said target; and
    d) transporting said substrate in front of said target to deposit a thin film on said substrate; and
    e) extinguishing said plasma once said substrate is no longer in front of said target.

9. A system for reducing defects on a substrate during sputter deposition comprising:
    a target rotatable about an axis and having an outside surface;
    a power supply to supply a voltage to said target, said voltage sufficient to generate a plasma;
    a magnet operatively positioned relative to said target and producing a magnetic field sufficient to penetrate said target to confine said plasma near a portion of the outside surface of said target upon application of said voltage to said target, said portion of the outside surface of said target exposed to said plasma;
    a rotatable holder for rotating said target along said axis and relative to said magnet, and upon complete rotation of said target, a substantial portion of said outside surface of said target is exposed to said plasma;
    a transport for moving a substrate in front of said target; and
    a controller for igniting and extinguishing said plasma according to said substrate position.

10. The system of claim 9 wherein the transport further has a pallet for holding a plurality of substrates.

11. The system of claim 9 wherein the transport further has an adjustable speed.

12. The system of claim 9 wherein said target includes carbon.

13. The system of claim 9 wherein said magnet is a permanent magnet.

14. The system of claim 9 further comprising a coolant for cooling said target and said magnet.

15. The system of claim 9 further comprising a second target, a second magnet, and a second rotatable holder, said second target operatively positioned to permit movement of said substrate between said target and said second target.

16. The system of claim 9 further comprising a chamber substantially enclosing said target, said magnet, said rotatable holder, and said transport, said chamber capable of maintaining a vacuum.

17. The system of claim 16 further including a cathode located inside said chamber, said cathode electrically connected to said target and said power supply.

18. The system of claim 17 wherein said cathode is substantially enclosed by said target.

19. The system of claim 16 further comprising a vacuum feed-through for coupling said transport to an external motor.

20. A system for reducing defects on a substrate during sputter deposition, comprising:
    a target with an outside surface;
    means for determining a substrate position;
    means for igniting and extinguishing plasma according to said substrate position;
    means for confining said plasma to expose a portion of the outside surface of said target to said plasma;
    means for rotating said target to expose substantially all of the outside surface of said target to said plasma; and
    means for moving said substrate in front of said target.

* * * * *